(12) United States Patent
Lee et al.

(10) Patent No.: US 8,808,841 B2
(45) Date of Patent: Aug. 19, 2014

(54) INSERT SHEET AND METHOD FOR MANUFACTURING THE SAME

(75) Inventors: Min-Ho Lee, Busan (KR); Jin-Woo Kim, Ulsan (KR); Hyung-Gon Kim, Ulsan (KR)

(73) Assignee: LG Hausys, Ltd., Seoul (KR)

( * ) Notice: Subject to any disclaimer, the term of this patent is extended or adjusted under 35 U.S.C. 154(b) by 17 days.

(21) Appl. No.: 13/070,345

(22) Filed: Mar. 23, 2011

(65) Prior Publication Data

US 2011/0171433 A1    Jul. 14, 2011

Related U.S. Application Data

(63) Continuation of application No. PCT/KR2009/005411, filed on Sep. 23, 2009.

(30) Foreign Application Priority Data

Sep. 23, 2008 (KR) .................. 10-2008-0093148

(51) Int. Cl.
    *B32B 3/30*      (2006.01)

(52) U.S. Cl.
    USPC .......... 428/203; 428/195.1; 428/201; 428/209

(58) Field of Classification Search
    USPC .................. 428/195.1, 201, 203, 209
    See application file for complete search history.

(56) References Cited

FOREIGN PATENT DOCUMENTS

| | | |
|---|---|---|
| JP | 2001-138468 A | 5/2001 |
| JP | 2003-145673 A | 5/2003 |
| JP | 2004-284119 A | 10/2004 |
| JP | 2008-110518 A | 5/2008 |
| KR | 10-2006-0078530 A | 7/2006 |
| KR | 10-0840992 B1 | 6/2008 |

OTHER PUBLICATIONS

Machine translation of JP 2003-145673.*
Machine translation of Kr 10-20070036742.*

* cited by examiner

*Primary Examiner* — Mark Ruthkosky
*Assistant Examiner* — Christopher Polley
(74) *Attorney, Agent, or Firm* — Nath, Goldberg & Meyer; Jerald L. Meyer; Stanley N. Protigal

(57) ABSTRACT

The present disclosure relates to insert sheets and a method for manufacturing same. A film of the present invention is applicable to a variety of insert moldings or injection moldings to achieve appearance effects such as an excellent metal texture and the like, and maintain excellence in the overall physical properties such as surface properties, formability, scratch resistance, impact resistance, heat resistance, wear resistance, chemical resistance, and light resistance, etc.

15 Claims, 3 Drawing Sheets

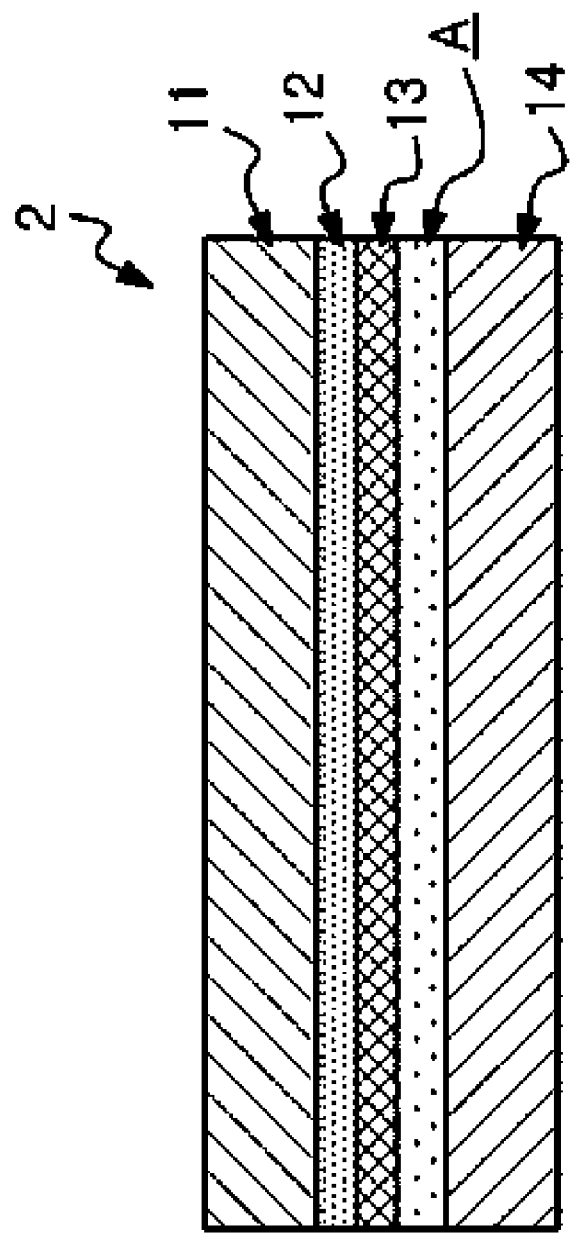

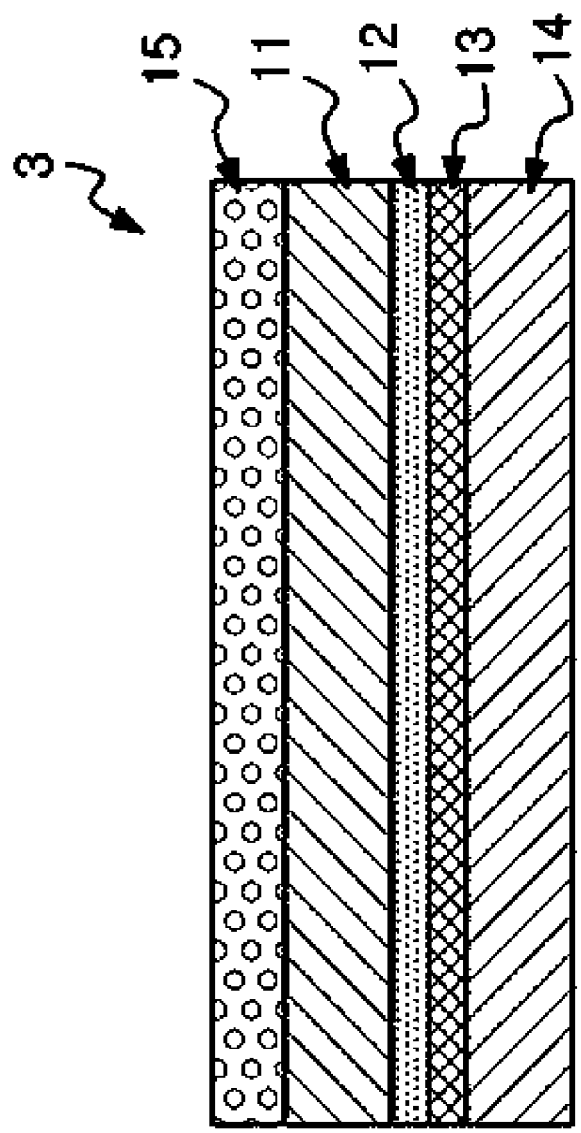

INSERT SHEET AND METHOD FOR MANUFACTURING THE SAME

CROSS REFERENCE TO RELATED APPLICATION

This application is a continuation application of PCT/KR2009/005411 with the international filing date of Sep. 23, 2009 which claims the priority to Korean Patent Application No. 10-2008-0093148 filed on Sep. 23, 2008, the entire contents of which applications are incorporated by reference herein.

TECHNICAL FIELD

The present disclosure relates to insert sheets and methods for manufacturing the same.

BACKGROUND ART

Insert sheets (or insert films) refer to sheets or films that are applied to a surface of a molded product in insert molding or injection molding to provide a variety of decorative effects. Examples of insert sheets include sheets for decorating molded products simultaneously with molding, such as a sheet for decorating a molded product simultaneously with injection molding, which can form a decorative layer on a surface of a molded product simultaneously with insert or injection molding. The insert sheets are used for a wide range of applications, including auto interior materials (e.g., a center fascia, window switch, and console box), auto exterior materials (e.g., a mirror housing, side molding and bumper cap), housings for electric home appliances, electronic devices (e.g., a mobile phone and a notebook computer), and the like.

Typically, an insert sheet is formed with a decorative layer, which can realize a metallic appearance with a variety of patterns, by various processes, such as gravure printing. However, the decorative layer formed by the existing process has problems of significantly inferior adhesion to actual metal (for example, chrome and stainless steel), artificial appearance, and the like.

Accordingly, an attempt has recently been made to realize a variety of metallic appearances through a metal deposition process such as vacuum deposition or the like. However, a metal deposition layer formed by vacuum deposition has a problem in that the insert sheet including the metal deposition layer suffers from deterioration of endurance or the like due to low adhesion between the decorative layer and an adherent, that is, a synthetic resin substrate. Another problem with the conventional process is that the properties of the insert sheet such as surface endurance and formability are not satisfactory, uniformity of the metal deposition layer is low, and the deposition layer may be cracked in the process of molding.

The above information disclosed in this Background section is only for enhancement of understanding of the background of the invention and therefore it may contain information that does not form the prior art that is already known in this country to a person of ordinary skill in the art.

SUMMARY OF THE DISCLOSURE

In accordance with one aspect, the present invention provides an insert sheet, which includes: a transparent film; a hairline layer formed on a surface of the transparent film; a metal deposition layer formed on the hairline layer; and a support sheet formed on the metal deposition layer.

In accordance with another aspect, the present invention provides a method for manufacturing an insert sheet, which includes: forming a hairline layer on a surface of a transparent film; forming a metal deposition layer on the hairline layer; and forming a support sheet on the metal deposition layer.

Exemplary embodiments of the invention provide an insert sheet, which includes a transparent film having a hairline layer formed on a back side thereof and a metal deposition layer formed on the hairline layer, and a method for manufacturing the same. In the insert sheet according to the embodiment, the hairline layer is formed on the back side of the transparent film, so that the insert sheet can exhibit excellent surface properties, endurance, and formability. Further, according to the embodiments, the metal deposition layer may, suitably, be formed by sputtering so that the deposition layer may be formed to include various metals without being limited to the material for an adherent.

According to the embodiments, it is possible to provide a uniform and thin metal deposition layer, which exhibits excellent adhesion to the transparent film and does not suffer from cracking upon molding. Accordingly, when applied to a variety of products formed by insert molding or injection molding, the insert films according to the embodiments may provide excellent appearance such as a highly metallic appearance while exhibiting excellent properties such as surface properties, formability, scratch resistance, impact resistance, heat resistance, wear resistance, chemical resistance, light resistance, and the like.

The above and other features and advantages of the present invention will be apparent from or are set forth in more detail in the accompanying drawings, which are incorporated in and form a part of this specification, and the following Detailed Description, which together serve to explain by way of example the principles of the present invention.

BRIEF DESCRIPTION OF DRAWINGS

FIGS. 1 to 3 are side sectional views of insert sheets in accordance with exemplary embodiments of the present invention.

DETAILED DESCRIPTION OF THE DISCLOSURE

Figure 1:
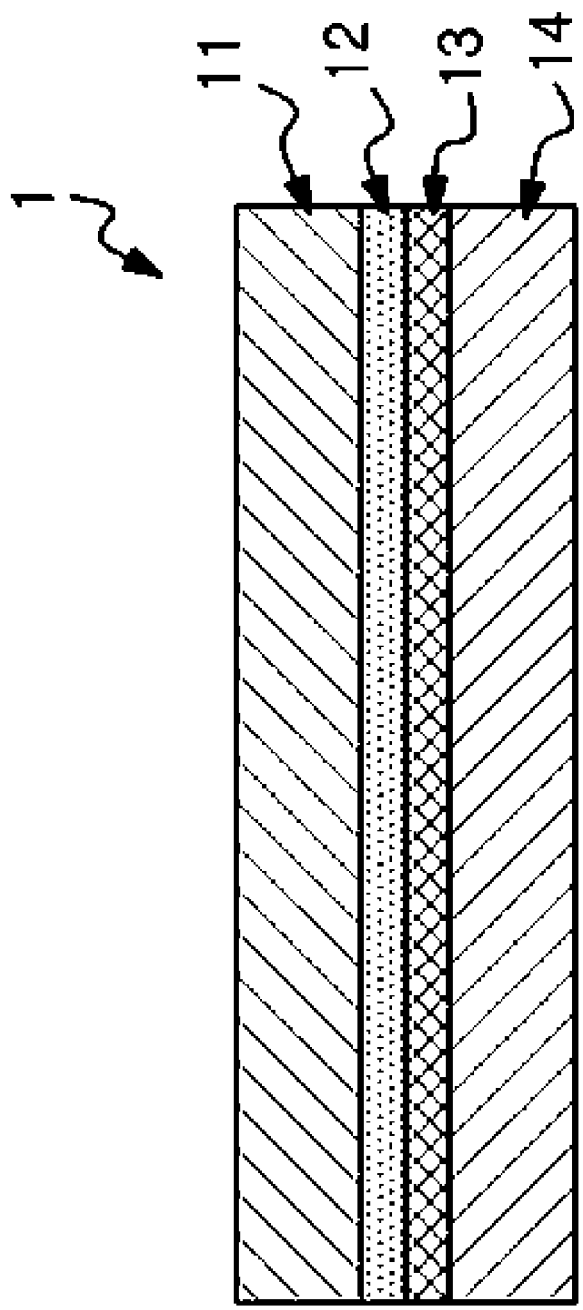

Reference will now be made in detail to the preferred embodiment of the present invention, examples of which are illustrated in the drawings attached hereinafter, wherein like reference numerals refer to like elements throughout. The embodiments are described below so as to explain the present invention by referring to the figures.

As discussed above, in one aspect, the present invention provides an insert sheet. FIG. 1 illustrates an insert sheet 1 according to an embodiment of the invention. Specifically, the insert sheet 1 according to the embodiment includes a support sheet 14, a metal deposition layer 13, a hairline layer 12, and a transparent film 11, which are sequentially formed from a lower side to an upper side thereof. As shown in FIG. 1, the hairline layer 12 (hereinafter, also referred to as an "inside hairline layer") capable of providing a decorative effect is formed on the back side (surface) of the transparent film 11. Herein, the term "back side of the transparent film" refers to a side (surface) of the transparent film opposite to the surface (surface) of the transparent film facing an outside of a molded product when the insert sheet is applied to the molded product. In this embodiment, the hairline layer 12 is formed on the back side of the transparent film, thereby providing the insert sheet 1 with excellent surface properties, surface endurance, scratch resistance, wear resistance, chemical resistance, light resistance or the like as well as a highly metallic appearance.

As the transparent film 11, any type of a film that is transparent may be used. Non-limiting examples of the film may include a polyethylene terephthalate film, a polybutylene terephthalate film, a polycarbonate film, and a polymethyl methacrylate film. While not intending to limit, such a transparent film may be made by blending a thermoplastic resin, additives, and the like and extruding, pressing, or casting the resulting mixture.

In one embodiment, the transparent film 11 may have a thickness of 5 µm to 500 µm. If the transparent film 11 has a significantly low thickness, it becomes difficult to form the hairline layer 12 thereon or there is a possibility of deterioration in mechanical strength of the film. In some cases, there is a likelihood of thermal deformation of the film during formation of a surface-treated layer described below. If the transparent film 11 has a significantly high thickness, there is a possibility of deterioration in formability or coiling processibility of the film. However, it should be understood that the aforementioned thickness of the transparent film 11 is given by way of example. That is, the thickness of the transparent film may be adjusted in consideration of a desired utility of the insert sheet, a desired hairline pattern or the like.

According to the embodiment, the insert sheet 1 includes the hairline formed on the one side of the transparent film. Herein, the term "hairline" refers to a very thin line (scratch) that is formed on the transparent film and has a predetermined depth and a predetermined width. Further, the term "hairline layer" refers to a layer which has various patterns composed of such hairlines. It should be understood that the depth, width, and the number of hairlines are not limited to particular values and may be adjusted in consideration of a desired pattern or other design demands. In one embodiment, the hairline may have a depth of 0.1 µm to 1.0 µm, and an average width of 5 µm or less.

According to the embodiment, in the finished insert sheet, the hairline layer 12 is formed on the opposite side of the transparent film to the upper surface (side) of the transparent film 11. That is, the hairline layer 12 is formed on the back side of the transparent film 11. Herein, the term "upper surface of the transparent film" refers to the surface (side) of the transparent film facing an outside of a molded product when the insert sheet is applied to the molded product, and the term "back side of the transparent film" refers to the side opposite the upper surface, that is, a side of the transparent film facing the molded product when the insert sheet is applied to the molded product.

In this manner, as the hairline layer 12 is formed on the back side of the transparent film 11, the insert sheet applied to a molded product does not form irregularities which can be sensed by a user who touches the surface of the insert sheet 1, thereby enhancing not only surface properties of the insert sheet 1, but also surface endurance, scratch resistance, wear resistance, chemical resistance, and light resistance thereof.

In one embodiment, the hairline layer 12 may include at least one pattern selected from the group consisting of a hair pattern, a feather pattern, a thin cloud pattern, a comb pattern, a wave pattern, and a branch pattern. However, it should be understood that these hairline patterns are given by way of example and that the hairline pattern may be modified in various ways according to a desired use.

According to the invention, the method of forming the hairline layer 12 on the transparent film 11 is not limited to a particular one, and any known method may be used to form the hairline layer 12 on the transparent film 11. In one embodiment, an abrasive material (e.g., woven fabrics) having, for example, a fine abrasive member may be used to scratch the surface of the transparent film 11 to form a desired hairline pattern on the transparent film 11.

According to the embodiment, the insert sheet 1 includes the metal deposition layer 13 formed on the hairline layer 12. In this embodiment, the metal deposition layer 13 can be formed on the surface of the hairline layer 12 by various deposition processes, for example, vacuum deposition or sputtering. Herein, the term "vacuum deposition" refers to a process of evaporating a metal in vacuum and depositing the evaporated metal on a deposition target to form a deposition layer on the surface of the target. Further, the term "sputtering" refers to a process of introducing an inert gas such as argon into a vacuum condition while applying voltage between a substrate and a target (e.g., metal) to ionize the inert gas and force the ionized inert gas to collide with the target such that the substrate can be coated with atoms ejected from the target through such collision. In sputtering, the inert gas is injected into a vacuum chamber to generate plasma, and atoms or molecules emitted from the target reach the substrate to form the deposition film. In one embodiment of the invention, sputtering is employed to form the metal deposition layer 13. Namely, the metal deposition layer 13 may be a sputtering metal deposition layer. In some cases, sputtering may be advantageous. For example, the metal deposition layer 13 by sputtering may be more uniform and thinner, exhibit excellent adhesion to an adherent even without separate surface treatment such as primering with respect to the hairline layer 12, and have no or less defects such as cracks thereon when the insert sheet 1 is applied to insert or injection molding.

In one embodiment, the metal deposition layer 13 may include at least one selected from the group consisting of stainless steel, aluminum, chrome, nickel, tin, and copper. Further, the thickness of the metal deposition layer 13 is not specifically limited and may be adjusted in consideration of a desired effect and other design demands. For example, the metal deposition layer 13 may have a thickness of 50~500 Å, 100~500 Å, or 200~500 Å.

The support sheet 14 to be included in the insert sheet 1 is not limited to a particular kind. In other words, any known sheet may be used so long as it has excellent thermal fluidity and does not cause a gate burn phenomenon that an underlying resin is exposed and burnt due to heat during or after injection molding.

Non-limiting examples of the support sheet 14 may include an acrylonitrile butadiene styrene (ABS) film, a polyvinylchloride (PVC) film, an ethylene-vinyl acetate (EVA) film, and an any combination thereof.

In one embodiment, the support sheet 14 may have a thickness of 100~10,000 µm. If the support sheet 14 has a thickness less than 100 µm, there formability may be deteriorated or the gate burning may occur during formation of the insert sheet 1. On the other hand, if the support sheet 14 has a thickness greater than 10,000 µm, e.g., coiling processibility may be deteriorated. However, it should be understood that the aforementioned thickness of the support sheet is given by way of example and may be variously changed.

FIG. 2 illustrates an insert sheet 2 according to another embodiment of the invention. In this embodiment, the support sheet 14 is adhered to the metal deposition layer 13 via an adhesive layer A. Any type of an adhesive layer that can perform an adhesion function may be used. For example, any polyester adhesive, polyurethane adhesive, polyamide adhesive, ethylene vinyl acetate adhesive or acrylic adhesive known in the art may be used to form the adhesive layer A.

According to one embodiment, solvent type adhesives (or solvent impregnated-type adhesives) or film type adhesives may be used to bond the support sheet 14 to the metal deposition layer 13. In case of a solvent type adhesive, any of the adhesive resins as described above may be impregnated into a suitable solvent to prepare the solvent type adhesive, which in turn is coated on the metal deposition layer 13 by gravure coating or the like, followed by bonding the metal deposition layer 13 to the support sheet 14. In case of a film type adhesive, an adhesive containing any of the adhesive resins described above may be applied to a film through extrusion or the like to prepare the film type adhesive, which is in turn applied to the metal deposition layer 13 or support sheet 14.

Preferably, the adhesive layer A has a thickness of 0.1 μm to 500 μm. If the thickness of the adhesive layer is less than 0.1 μm, interface adhesion between the support film 14 and the metal deposition layer 14 may be deteriorated upon bonding of an additional film such as a colored film or the like. On the other hand, if the thickness of the adhesive layer exceeds 500 μm, coiling processibility may be deteriorated due to a blocking phenomenon.

FIG. 3 illustrates an insert sheet 3 according to still another embodiment of the invention, the insert sheet 3 includes a surface-treated layer 15 formed on the upper surface of the transparent film 11. The surface-treated layer 15 assists in further improvement of the formability and surface properties of the film. Further, the surface-treated layer 15 may serve to improve endurance and elongation of the insert sheet.

The surface-treated layer 15 may be made of any known surface treatment material. Specifically, the surface-treated layer 15 may be made of at least one selected from the group consisting of acrylic resins, urethane resins, epoxy resins, polyester resins, and fluorine resins. The surface treatment material is not limited to a particular resin among these reins, and any suitable resin may be selected for the surface-treated layer 15 in consideration of a desired use and other design demands.

According to the invention, the method for forming the surface-treated layer 15 using such a material is not limited to a particular method. For example, a coating liquid is prepared by dissolving and dispersing any of the resins described above and additives in a suitable solvent, coating the transparent film 11 using a bar coater or the like, and drying, thereby forming the surface-treated layer 15.

According to one embodiment, the coating liquid may contain the resin(s) as described above, a curing agent, and, if necessary, a suitable amount of matting agent. In this case, the curing agent is not limited to a particular type and may be suitably selected in consideration of the resin used for the coating liquid and the kind of crosslinking functional groups included in the resin. Particularly, a variety of isocynate-based curing agent or amine-based curing agents may be used. Further, the matting agent is a component capable of imparting light resistance to the surface-treated layer 15 and may be selected from any known component in the art without being limited to a particular kind.

In one embodiment of the invention, the coating liquid may include 80~130 parts by weight of the resin described above, 0.01~80 parts by weight of the curing agent, and, if added, about 0.01~15 parts by weight of the matting agent based on the content of resin or curing agent. Further, the coating liquid may be prepared in a solid amount of about 10 wt % to 80 wt % based on the resin component. Particularly, when the surface-treated layer 15 is formed of an acrylic resin, the coating liquid may include 100 parts by weight of the acrylic resin, 0.5~5 parts by weight of the curing agent (e.g., isocyanate-based curing agent), and, if necessary, 0.5~10 parts by weight of the matting agent based on the content of the acrylic resin or curing agent, and may be formed in a solid amount of about 30~50 wt % based on the resin component. However, it should be understood that the composition of the coating liquid is given by way of example and may be adjusted according to desired properties.

Preferably, the surface-treated layer 15 may have a thickness of about 0.5~30 μm. If the thickness of the surface-treated layer 15 is less than 0.5 μm, effects obtained by formation of the surface-treated layer 15 can become insignificant, and if the thickness of the surface-treated layer 15 exceeds 30 μm, formability or elongation may be deteriorated.

In another aspect, as discussed above, the present invention provides a method for manufacturing an insert sheet. The method according to am embodiment includes the steps of: forming a hairline layer on one side of a transparent film; forming a metal deposition layer on the hairline layer; and forming a support sheet on the metal deposition layer.

The step of forming a hairline layer is not limited to a particular process. Suitably, as described above, the hairline layer may be formed by scratching one side of the transparent film using an abrasive material. A typical example of the abrasive material is a sandpaper. A preferable mesh size of the sandpaper may be about 200~2,000 mesh. With the mesh within this range, a suitable number and depth of lines can be provided so as to allow the hairline pattern to exhibit excellent texture. However, this mesh range of the abrasive material is given by way of example and may be adjusted according to a desired effect and design demands. It should be understood that the hairline layer may be formed through any known process without being limited to the process described above.

The step of forming a metal deposition layer on the hairline layer is performed by depositing a metal on the hairline layer to form the metal deposition layer. As described above, the metal deposition layer may be formed by vacuum deposition or sputtering. Advantageously, sputtering may be used to form the metal deposition layer. However, when forming the deposition layer using a metal having a relatively low melting point, such as aluminum or copper, vacuum deposition may be advantageous. Conditions for the vacuum deposition or sputtering are not limited to particular conditions and may be suitably selected in consideration of the kind of a metal used and other processing requirements.

The step of forming a support sheet on the metal deposition layer is performed by attaching the support sheet to the metal deposition layer. Here, the process of attaching the support sheet is not limited to a particular kind. For example, the support sheet may be attached thereto by a typical thermal stacking process known in the art. Alternatively, the support layer may be attached to the metal deposition layer by forming an appropriate solvent type adhesive layer (or solvent impregnated-type adhesive layer) or a film type adhesive layer on the surface of the metal deposition layer, followed by stacking and heating the support sheet on the adhesive layer to combine the support sheet with the metal deposition layer through the adhesive layer, as described above.

In an embodiment, the method for manufacturing the insert sheet may further include forming a surface-treated layer on the transparent film. The surface-treated layer is formed on a surface of the transparent film opposite to the side of the transparent film, on which the hairline layer is formed or to be formed. The process of forming the surface-treated layer is not limited to a particular kind. For example, the surface-treated layer may be formed by depositing and drying a coating liquid on the transparent film, as described above. Further, in this process, the method or conditions for mixing, depositing and drying the coating liquid are not limited to particular kinds and may be suitably adjusted according to a desired use. In addition, the step of forming the surface-treated layer may be carried out at an appropriate time point before or after forming the hairline layer on the transparent film, before or after forming the metal deposition layer, or before or after forming the support sheet. The time point of forming the surface-treated layer is not limited to a particular time point. According to one embodiment, the step of forming the surface-treated layer may be carried out before attaching the support sheet and after sequentially forming the hairline layer and the metal deposition layer on the transparent film.

EXAMPLES

The following examples illustrate the invention and are not intended to limit the same.

Example 1

A polybutylene terephthalate film was prepared as a transparent film, and a hairline layer composed of a hair pattern was formed on the back side of the polybutylene terephthalate film using a sandpaper. Then, a copper deposition layer was formed on the surface of the hairline layer by sputtering. Then, an adhesive coating liquid prepared by dissolving an isocynate-based curing agent and an acrylic resin in methylethylketone is deposited on the metal deposition layer to form an adhesive layer. Then, a coating liquid (solid content: 35 wt %) prepared by dissolving 100 parts by weight of an acrylic resin and 2 parts by weight of an isocynate-based curing agent in methylethylketone was deposited and dried on the other surface of the transparent film than the surface on which the transparent film having the hairline layer was formed, thereby forming a surface treated layer. Then, an EVA resin film was stacked on the adhesive layer formed on the metal deposition layer, heated and combined therewith, thereby providing an insert sheet.

Example 2

A polyethylene terephthalate film (thickness: 50 µm, SL80C, SKC Co., Ltd.) was prepared as a transparent film, and a hairline layer composed of a hair pattern was formed on a surface of the polyethylene terephthalate film using a sandpaper (600 mesh). Here, the hairline layer has an average line number of 120 lines and a depth of about 0.2 µm. Then, Stainless 304 was sputtered onto the upper side of the hairline layer to form a metal thin film of a thickness of 0.85 OD (Optical Density). Then, an adhesive coating liquid (solid content: 35 wt %) prepared by dissolving 100 parts by weight of a polyester resin and 0.6 parts by weight of an isocynate-based curing agent in methylethylketone was deposited on the metal deposition layer to form an adhesive layer having a thickness of 0.2 µm. Then, a coating liquid (solid content: 35 wt %) prepared by dissolving 100 parts by weight of an acrylic resin and 2 parts by weight of an isocynate-based curing agent in methylethylketone was deposited and dried on the other surface of the transparent film than the surface of the transparent film having the hairline layer formed thereon, followed by heat curing to form a surface treated layer having a thickness of about 10 µm. Then, a 500 µm thick ABS film (MA221, LG Chemical Co., Ltd.) was stacked on the adhesive layer, heated and combined therewith, thereby providing an insert sheet.

Appearance, scratch resistance, impact resistance, heat resistance, wear resistance, chemical resistance and sun cream resistance of the prepared insert sheets (films) were evaluated under the following conditions. Results of the evaluation are listed in Table 1.

1. Appearance

The appearance of each of the films was observed through naked eyes. In Table 1, the mark "x" represents that there was inflation, delamination or bubbles on the observed film while the mark "○" represents that there was no such a phenomenon.

2. Scratch Resistance

Scratch resistance was evaluated by sapphire test according to JIS K 6718 (Success standard: 3.5 level or more).

3. Impact Resistance

Impact resistance was evaluated by dropping a weight (12.7 mm, 0.5 Kgf) onto the insert sheets from a height of 20 cm. In Table 1, the mark "x" represents that there was delamination or splitting of the evaluated film after dropping while the mark "○" represents that there was no such a phenomenon.

4. Heat Resistance

Heat resistance of the insert sheets was evaluated by observing whether initial state of adherence is maintained after leaving the prepared films at 80° C. for 300 hours. In Table 1, the mark "○" represents that initial state of adherence was maintained while the mark "x" represents that initial state of adherence was not maintained.

5. Wear Resistance

Wear resistance was evaluated through dry or wet friction test using a friction member at a load of 1.0 Kgf and at a scribing rate of 60 RPM. In Table 1, the mark "○" represents that the tested sheet passed the dry friction test (i.e., 10,000 cycles or greater) and the wet friction test (i.e., 10,000 cycles or greater) while the mark "x" represents that the tested sheet did not pass either the dry friction test or the wet friction test.

6. Chemical Resistance

Gasoline, engine oil, wax, grease, a glass cleaning agent and ethyl alcohol were applied to the insert sheets. In Table 1, the mark "○" represents that there was no discoloration, fading, swelling and cracking of the tested sheet while the mark "x" represents that one or more of these phenomena occurred.

7. Wear Resistance 0.2 g of a sun cream was applied to the insert sheets and left at 80° C. for 1 hour, followed by scratching the insert sheets. In Table 1, the mark "○" represents that there was no delamination of the tested sheet while the mark "x" represents that there was delamination.

TABLE 1

|  | Example 1 | Example 2 |
|---|---|---|
| Appearance | ○ | ○ |
| Scratch resistance | Level 4 | Level 4 |
| Impact resistance | ○ | ○ |
| Heat resistance | ○ | ○ |
| Wear resistance | ○ | ○ |
| Chemical resistance | ○ | ○ |
| Sun cream resistance | ○ | ○ |

As described in Table 1, the insert sheets of the examples had excellent properties such as appearance, scratch resistance, impact resistance, heat resistance, wear resistance, chemical resistance, and sun cream resistance.

The insert sheets according to the embodiments may be applied to insert molding or injection molding to provide an effect of decorating the surface of a molded product. Further, the insert sheets may be used as a film for decorating a molded product simultaneously with molding, which is applied to a process of decorating simultaneously with molding to form a decorative layer on the surface of the molded product simultaneously with insert or injection molding.

The invention has been described in detail with reference to preferred embodiments thereof. However, it will be appreciated by those skilled in the art that changes may be made in these embodiments without departing from the principles and spirit of the invention, the scope of which is defined in the appended claims and their equivalents.

The invention claimed is:

1. An insert sheet comprising:
   a transparent film;
   a hairline layer formed on a surface of the transparent film;
   a metal deposition layer formed on the hairline layer, whereby the hairline layer in combination with the metal deposition layer provides a decorative effect; and
   a support sheet formed on the metal deposition layer, wherein the support sheet comprises an acrylonitrile butadiene styrene copolymer sheet.

2. The insert sheet of claim 1, wherein the transparent film is a polyethylene terephthalate film, a polybutylene terephthalate film, a polycarbonate film, or a polymethyl methacrylate film.

3. The insert sheet of claim 1, wherein the transparent film has a thickness of 5 μm to 500 μm.

4. The insert sheet of claim 1, wherein the hairline layer has at least one predetermined decorative pattern thereon.

5. The insert sheet of claim 1, wherein the hairline layer has thin lines formed thereon, the thin lines having a depth of 0.1 μm to 1.0 μm, and an average width of 5 μm or less.

6. The insert sheet of claim 1, wherein the metal deposition layer is a sputtered metal deposition layer.

7. The insert sheet of claim 1, wherein the metal deposition layer comprises at least one selected from the group consisting of stainless steel, aluminum, chrome, nickel, tin, and copper.

8. The insert sheet of claim 1, wherein the metal deposition layer has a thickness of 50~500 Å.

9. The insert sheet of claim 1, wherein the support sheet has a thickness of 100~10,000 μm.

10. The insert sheet of claim 1, wherein the support sheet is attached to the metal deposition layer via an adhesive layer.

11. The insert sheet of claim 10, wherein the adhesive layer contains at least one selected from the group consisting of polyester adhesives, polyurethane adhesives, polyamide adhesives, ethylene vinyl acetate adhesives, and acrylic adhesives.

12. The insert sheet of claim 1, further comprising a surface-treatment layer on a surface of the transparent film other than the surface on which the hairline layer is formed.

13. The insert sheet of claim 12, wherein the surface-treated layer has a thickness of 0.5~30 μm.

14. The insert sheet of claim 12, wherein the surface-treated layer comprises at least one selected from the group consisting of acrylic resins, urethane resins, epoxy resins, polyester resins, and fluorine resins.

15. The insert sheet of claim 1, wherein the hairline layer provides the decorative effect not by forming irregularities on an outer surface of the insert sheet.

* * * * *